(12) United States Patent
Lassmann et al.

(10) Patent No.: US 9,265,148 B2
(45) Date of Patent: Feb. 16, 2016

(54) PRINTED CIRCUIT BOARD AND CONTROL DEVICE FOR A VEHICLE TRANSMISSION COMPRISING THE PRINTED CIRCUIT BOARD

(75) Inventors: Wilfried Lassmann, Hirschau (DE);
Christian Büttner, Pegnitz (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 14/124,298

(22) PCT Filed: May 8, 2012

(86) PCT No.: PCT/EP2012/058438
§ 371 (c)(1),
(2), (4) Date: Feb. 28, 2014

(87) PCT Pub. No.: WO2012/168018
PCT Pub. Date: Dec. 13, 2012

(65) Prior Publication Data
US 2014/0182898 A1 Jul. 3, 2014

(30) Foreign Application Priority Data

Jun. 8, 2011 (DE) .......... 10 2011 077 206

(51) Int. Cl.
*H05K 1/00* (2006.01)
*H05K 1/11* (2006.01)
*H05K 1/02* (2006.01)
(Continued)

(52) U.S. Cl.
CPC .............. *H05K 1/115* (2013.01); *H05K 1/0201* (2013.01); *H05K 1/0206* (2013.01); *H05K 1/0207* (2013.01); *H05K 5/0082* (2013.01); *H05K 3/4608* (2013.01); *H05K 2201/09309* (2013.01);
(Continued)

(58) Field of Classification Search
CPC ... H05K 1/115; H05K 1/0201; H05K 1/0206; H05K 1/0298; H05K 5/0082
USPC .......................................... 174/252; 361/720
See application file for complete search history.

(56) References Cited

U.S. PATENT DOCUMENTS

| 4,839,774 A | * | 6/1989 | Hamburgen | .................. 361/693 |
| 6,201,701 B1 | * | 3/2001 | Linden et al. | ................. 361/720 |

(Continued)

FOREIGN PATENT DOCUMENTS

| DE | 43 35 946 A1 | 4/1995 |
| DE | 195 16 547 A1 | 11/1996 |

(Continued)

OTHER PUBLICATIONS

Chander et al., "Ultra-Fine Feature Printed Circuits and Multi-Chip Modules", GEC Journal of Research, GEC Marconi Research Center, Great Baddow Chemsford, GB, Bd. 11, Nr. 2, Jan. 1, 1994, Seiten 90-98.

(Continued)

*Primary Examiner* — Steven T Sawyer
(74) *Attorney, Agent, or Firm* — Dority & Manning, P.A.

(57) ABSTRACT

The invention proposes a printed circuit board with multiple layers, which features at least one outer layer and at least one inner layer adjacent to the outer layer. The printed circuit board features a plurality of micro-through-holes, which are formed between a supply voltage area of at least one outer layer and a supply voltage area of at least one inner layer.

12 Claims, 4 Drawing Sheets

(51) Int. Cl.
*H05K 5/00* (2006.01)
*H05K 3/46* (2006.01)

(52) U.S. Cl.
CPC ............... *H05K 2201/09663* (2013.01); *H05K 2201/09781* (2013.01)

(56) References Cited

U.S. PATENT DOCUMENTS

| | | | |
|---|---|---|---|
| 6,205,028 B1* | 3/2001 | Matsumura | 361/720 |
| 6,350,540 B1 | 2/2002 | Sugita et al. | |
| 6,384,706 B1* | 5/2002 | Iwanami | 336/200 |
| 7,087,845 B2 | 8/2006 | Tohkairin et al. | |
| 7,294,007 B1* | 11/2007 | Lawlyes et al. | 439/276 |
| 7,978,031 B2 | 7/2011 | Goi et al. | |
| 2002/0047193 A1 | 4/2002 | Dorfler et al. | |
| 2003/0128522 A1* | 7/2003 | Takeda et al. | 361/715 |
| 2003/0146020 A1 | 8/2003 | Brist et al. | |
| 2005/0104685 A1* | 5/2005 | Kuroki et al. | 333/133 |
| 2006/0180821 A1 | 8/2006 | Fan et al. | |
| 2008/0082947 A1* | 4/2008 | Ueda et al. | 716/8 |
| 2009/0052146 A1 | 2/2009 | Busch et al. | |
| 2009/0294165 A1* | 12/2009 | Thomas | 174/263 |
| 2010/0226098 A1 | 9/2010 | Loibl et al. | |

FOREIGN PATENT DOCUMENTS

| | | |
|---|---|---|
| DE | 10 2008 029410 A1 | 12/2009 |
| EP | 0 600 590 A1 | 6/1994 |
| EP | 1 715 732 A2 | 10/2006 |
| FR | 2560731 A1 | 9/1985 |
| WO | WO 00/62585 | 10/2000 |

OTHER PUBLICATIONS

PCT International Search Report, Aug. 8, 2012.
German Patent Office Search Report, Mar. 20, 2012.
PCT International Report on Patentability, Aug. 6, 2013.

\* cited by examiner

PRINTED CIRCUIT BOARD AND CONTROL DEVICE FOR A VEHICLE TRANSMISSION COMPRISING THE PRINTED CIRCUIT BOARD

FIELD OF THE INVENTION

The present invention relates to a printed circuit board with multiple layers, and a control device for a transmission of a vehicle with the printed circuit board.

BACKGROUND

A multilayer printed circuit board, a so-called multilayer board, consists of multiple contact layers, such as ground and power layers. Furthermore, there are signal layers for unbundling the connections from the circuit diagram. The individual layers are isolated from one another and are filled with epoxy-reinforced glass fiber material, such as FR4 material. Conducting paths and technologies have the task of making connections, even through all layers. FR4, one of the materials that is primarily used, is a poor conductor of heat.

DE 10 2008 029 410 A1discloses a device for conducting current. The device comprises an element that generates heat, a printed circuit board on which the element generating heat is applied, and a heat sink that is thermally coupled for dissipating heat on the element.

SUMMARY OF THE INVENTION

Against this background, the present invention creates an improved printed circuit board and an improved control device with the printed circuit board for a transmission of a vehicle, in accordance with the principal requirements. Advantageous forms arise from the claims and the following description.

Additional objects and advantages of the invention will be set forth in part in the following description, or may be obvious from the description, or may be learned through practice of the invention.

A multilayer printed circuit board may feature a majority of micro-through-holes or microvias, as the case may be, that produce conductive connections between at least one outer layer and at least one nearest inner layer of the printed circuit board. In a supply voltage area of the printed circuit board, many micro-through-holes may be arranged tightly close to one another in a very confined space.

Advantageously, through the majority of micro-through-holes, topological structures may be created that have a beneficial impact on the thermal behavior of the printed circuit board. The dissipation of heat at a printed circuit board may take place through conducting paths or conducting surfaces, as the case may be, and through-holes or vias, as the case may be, in particular through their copper tubes. By thermally coupling with one another at least one outer layer of the printed circuit board, and at least one inner layer of the printed circuit board adjacent to the outer layer, through the use of the majority of micro-through-holes, the overall thermal resistance of the printed circuit board is reduced. In addition to improving the overall thermal resistance, improved heat capacity or thermal dissipation arises. In particular, the thermal resistance between the outer two layers of the printed circuit board can be reduced. Thus, through the majority of micro-through-holes, heat may be removed very quickly and across large areas, for example from a circuit heated during operation on a surface of the printed circuit board, into an inner area of the printed circuit board. In the inner area of the printed circuit board, the heat may be, on the one hand, distributed, and, on the other hand, diverted through additional through-holes to an opposite side of the printed circuit board, which can act as a heat sink. On the surface of the printed circuit board acting as a heat sink, heat may be quickly led across large areas from the inside of the printed circuit board through the majority of micro-through-holes. Thus, embodiments of the present invention offer the advantage of improved heat dissipation for printed circuit boards. This improvement in thermal behavior does not require the use of elaborate technologies, such as ceramic printed circuit boards. Thus, the unit costs may be kept low, and uncomplicated bonding technology (for example) may be used. For EMC strategies (EMC=electromagnetic compatibility), in accordance with the embodiments of the present invention, there is plenty of room on the printed circuit board for an EMC-robust design.

The present invention creates a printed circuit board with multiple layers that feature at least one outer layer and at least one inner layer adjacent to the outer layer, characterized by a majority of micro-through-holes, which are formed between a supply voltage area of at least one outer layer and a supply voltage area of at least one inner layer.

The printed circuit board may comprise one printed circuit board for one electrical circuit, which is or may be fitted with electrical components. In a particular embodiment in accordance with the invention, the printed circuit board may be a component of a control unit for a vehicle transmission. The printed circuit board may feature a stack made of the multiple layers. The multiple layers may be stacked in order to form a basic structure of the printed circuit board. At least one outer layer of the printed circuit board may comprise one outermost layer of the multiple layers of the printed circuit board. The printed circuit board may feature an outer layer on each of the opposing sides. The electrical circuit of the printed circuit board may be arranged on a first outer layer. For attaching the printed circuit board on a support element, such as a transmission housing or a circuit board, a second outer layer may be formed.

The printed circuit board may be formed from multiple layers of electrically insulating material, for example, from a fiber-plastic composite and/or fiber-reinforced plastic and/or plastic-reinforced fiberglass fabrics, such as from epoxy-reinforced fiberglass material such as FR4 material.

The printed circuit board serves as a support element for an electrical circuit. Each layer of electrically insulating material may be coated with an electrically conductive layer. Thereby, on the electrically insulating material, conducting paths or conducting surfaces may be formed as conductive connections to the electrical circuit. The electrically conductive layer is usually printed or etched from a thin layer of an electrically conductive material, such as copper. In at least one outer layer, at least one conducting path or conducting surface may be arranged. At least one inner layer borders at least one outer layer. At least one inner layer may comprise a signal layer, an unbundling layer or the like. At least one inner layer may feature a majority of conducting paths. The majority of micro-through-holes may be formed, for example, by means of a laser process. Thus, the micro-through-holes may comprise, for example, so-called "laser vias". In particular, the micro-through-holes may be formed as blind holes.

The majority of micro-through-holes produces a connection between at least one outer layer and at least one inner layer of the printed circuit board. In particular, the majority of micro-through-holes produces a connection between a supply voltage area of at least one outer layer of the printed circuit board and a supply voltage area of at least one inner layer of the printed circuit board. A supply voltage area may include an expansion across large areas of the electrically conductive material. Thereby, the supply voltage areas are at the same voltage potential, and are connected with one another with electrically conductive effect through the micro through-holes. For example, the supply voltage areas, in which the majority of micro-through-holes is formed, may be subject to ground potential. The supply voltage areas may be connected to corresponding supply voltage connections of the electrical circuit. The majority of micro-through-holes may be electrically isolated from signal lines of the printed circuit board, such that data signals are not transmitted through the majority of micro-through-holes. Additional through-holes, and even additional micro-through-holes, may be provided for transferring data signals.

The majority of micro-through-holes may be arranged in at least one group. Thereby, between adjacent micro-through-holes within at least one group, no conducting path may be arranged. At least one group may comprise, for example, a rectangular or square matrix of micro-through-holes or a group with any other form. A group may feature, for example, between 8 and 50 micro-through-holes, thus for example 9, 16, 25 or 36 micro-through-holes. An individual group may be arranged in a contiguous electrically conductive surface of the supply voltage area of at least one outer layer and in a contiguous electrically conductive surface of the supply voltage area of at least one inner layer. In a contiguous manner, this may mean that the contiguous electrically conductive surface, apart from possible point-shaped electrical insulators formed by the micro-through-holes, is not interrupted by electrically insulating areas. If multiple groups of micro-through-holes are formed, at least one separating conducting path, one separating electrical insulator, or one electrically conductive connection cable or connection surface may be arranged between the individual groups. Such an embodiment offers the advantage that the majority of micro-through-holes may be formed in an orderly and controlled configuration in the printed circuit board, whereas a number of micro-through-holes may be advantageously increased. A large number of micro-through-holes may be arranged, in particular, in areas of the printed circuit board that are exposed to a high heat input. Through one or more additional through-holes, the supply voltage area of at least one inner layer may be connected to additional layers of printed circuit boards, such that the heat fed by the majority of micro-through-holes may be further dissipated.

The majority of micro-through-holes may be at least partially filled with a heat-conductive material. The heat-conductive material may comprise an electrically conductive material. The heat-conductive material may feature a metal (for example), particularly copper. The majority of micro-through-holes may be lined with the heat-conductive material, whereas the heat-conductive material layer covers the walls of the majority of micro-through-holes in layers. As an alternative or in addition, the heat-conductive material may fill the majority of micro-through-holes, for example completely. Further, as an alternative or in addition, the heat-conductive material or another material selected according to need, may be arranged on a layer surface side of the printed circuit board in order to provide for an opening leading to the walls of the micro-through-hole, to the effect that the opening of the heat-conductive material or another material selected according to need is preferably concentric, in order to form a so-called "via pad" on the layer surface side. The arrangement of the via pad, which is preferably provided in a concentric manner, is not to be restrictively interpreted. Entirely depending on need, other conceivable forms of arrangement for the via pad, such as (for example), triangle-shaped, rectangular or circular, which are not necessarily to be concentrically arranged, could be conceivable. In any event, heat-conductive material (for example) surrounding the opening of the micro-through-hole may preferably reach up to the opening edge of the micro-through-hole, and also preferably forming a contact (for example by means of material closure or form closure) with the heat-conductive material at least partially filling the micro-through-hole.

The heat-conductive material may include, for example, more than one material. One such heat-conductive material in the majority of through-holes offers the advantage that a thermal connection of at least one outer layer on at least one inner layer is improved. The heat-conductive material improves heat dissipation and heat capacity.

In addition, the supply voltage areas may comprise those sections of the associated layers in which there are no conducting paths. Thereby, the supply voltage areas may be formed from a heat-conductive and electrically conductive material. A single supply voltage area may comprise contiguous or non-contiguous surfaces made of the heat-conductive and electrically conductive material. The supply voltage areas may be formed from a metal (for example), particularly copper. Thereby, the supply voltage areas may, within one layer of the printed circuit board, capture as a maximum the entire remaining space that is not used by conducting paths, contact surfaces and the like. Such an embodiment offers the advantage that the heat-conductive supply voltage areas have a very large expansion in terms of surface area, and that heat dissipation and heat capacity are significantly improved by this. In addition, supply voltage areas that are formed across areas that are as large as possible improve electromagnetic compatibility.

The supply voltage area may be a ground area. The inner layer may be a signal layer with a majority of conducting paths. Thus, the ground area may be a supply voltage area subject to ground potential. The signal layer may feature a majority of electrical conducting paths. The signal layer may serve the purpose of unbundling the printed circuit board. A printed circuit board in accordance with such an embodiment offers the advantage that good electromagnetic compatibility is achieved through the ground area, and the unbundling of the printed circuit board is made easier by the signal layer.

In accordance with one embodiment, where the printed circuit board features at least one supply voltage layer, a supply voltage area of at least one supply voltage layer features a greater thickness than the supply voltage area of at least one outer layer and/or at least one inner layer. The supply voltage layer may serve the purpose of supplying the electrical circuit with a supply voltage. The supply voltage layer may comprise a high current conducting layer. At least one inner layer may be arranged between at least one outer layer and at least one supply voltage layer. The supply voltage area of the at least one supply voltage layer may be, for example, two times up to twenty times thicker than the supply voltage area of the outer layer or the inner layer. The supply voltage area may be thicker than the supply voltage area of at least one outer layer. In addition or as an alternative, the supply voltage area may be thicker than the supply voltage area at least one inner layer. Such an embodiment offers the advantage that, through the thicker layer made of electrically conductive material, an increased amount of heat-conductive material is available in the supply voltage area. Thus, the heat capacity of the supply voltage area of the at least one supply voltage layer is increased, and the supply voltage area may act as a capacity buffer at high temperature loads.

Moreover, the printed circuit board may feature a first outer layer and a first inner layer, between which a first majority of micro-through-holes is formed, and a second outer layer and a second inner layer, between which a second majority of micro-through-holes is formed. Thereby, the two supply voltage layers may be arranged between the first inner layer and the second inner layer. The number of inner layers and the number of supply voltage layers may be smaller or larger. The individual layers of the printed circuit board may together form a stack. A sequence of layers in the stack may include, for example, the first outer layer, the first inner layer, the two supply voltage layers, the second inner layer, and the second outer layer. Thereby, an electrical circuit may be arranged on the first outer layer. The printed circuit board on a support element may be attached to the second outer layer.

Such a structure of the printed circuit board offers the advantage that the overall thermal resistance of the printed circuit board can be reduced. This is possible because the outer layers and the inner layers are thermally solidly coupled to one another, and the supply voltage may feature thicker supply voltage areas.

In addition, at least one through-hole filled with a heat-conductive material may be provided, which is formed through all layers of the printed circuit board. The through-hole may comprise a so-called "thermal through-hole" or "thermal via," as the case may be. At least one through-hole may, for example, extend as a filled through-hole from a first outer layer to a second outer layer through the printed circuit board. A majority of through-holes filled with heat-conductive material may be formed in the printed circuit board. A majority of through-holes filled with heat-conductive material may be formed in an area of the printed circuit board in which an electrical circuit is attached. Thereby, the electrical circuit may cover the through-holes filled with heat-conductive material. In addition or as an alternative, a majority of through-holes may be formed in another area of the printed circuit board. Through-holes filled with heat-conductive material may be surrounded by a majority of micro-through-holes. At least one through-hole filled with heat-conductive material may be connected, just like the majority of micro-through-holes, in an electrically conductive manner with the supply voltage area of the printed circuit board. Such a through-hole offers the advantage that heat from the layers of the printed circuit board may be dissipated through at least one through-hole over the entire thickness of the printed circuit board. If the printed circuit board is attached to a support element (for example), the dissipation of heat may take place through at least one through-hole on the support element. In particular, at least one through-hole may facilitate a further dissipation from at least one inner layer.

In particular, at least one group of micro-through-holes feature at least nine micro-through-holes. Thereby, the spacing of adjacent micro-through-holes within at least one group amounts to a maximum of 0.85 mm.

In this connection, one execution is such that the descriptions concerning a preferred number and a preferred arrangement of micro-through-holes likewise apply to via pads or to a group consisting of at least one via pad and one micro-through-hole, as one via pad preferably surrounds at least one micro-through-hole as described above. At least one group of micro-through-holes may comprise a matrix of micro-through-holes, which features (for example) three, four, five or six rows and/or columns of micro-through-holes. Thereby, the matrix need not be square or rectangular. The matrix may also feature rows and/or columns that are arranged in an offset manner. In particular, the spacing of adjacent micro-through-holes within at least one group may be between 0.5 mm and 0.85 mm. With a view to a group consisting of via pads, a maximum diameter of a via pad of up to 0.3 mm with a maximum diameter of the micro-through-hole of up to 0.1 mm is preferred, whereas the preferred spacing of up to a maximum of 0.85 mm is located between the opposite outer edges of two adjacent via pads. The embodiments described above offer the advantage that a large number of micro-through-holes may be housed on a small space. This improves the thermal properties of the printed circuit board.

The present invention also creates a control unit for a transmission of a vehicle with a printed circuit board as described above.

In conjunction with the control unit, a printed circuit board specified above may be advantageously employed or used, in order to avoid the overheating of individual circuit elements of the control unit. The control unit may feature a housing in which the printed circuit board may be at least partially incorporated. The control unit may take a central role in the transmission control of a vehicle. For this purpose, the control unit may also be connected to additional transmission control elements.

BRIEF DESCRIPTION OF THE DRAWINGS

The invention is more specifically illustrated as an example on the basis of the attached drawings. The following is shown.

DETAILED DESCRIPTION

Reference will now be made to embodiments of the invention, one or more examples of which are shown in the drawings. Each embodiment is provided by way of explanation of the invention, and not as a limitation of the invention. For example features illustrated or described as part of one embodiment can be combined with another embodiment to yield still another embodiment. It is intended that the present invention include these and other modifications and variations to the embodiments described herein.

In the following description of the preferred embodiments of the present invention, elements shown in the various figures and elements having similar effects use the same or similar reference signs, whereas a repeated description of these elements is omitted.

Figure 1:
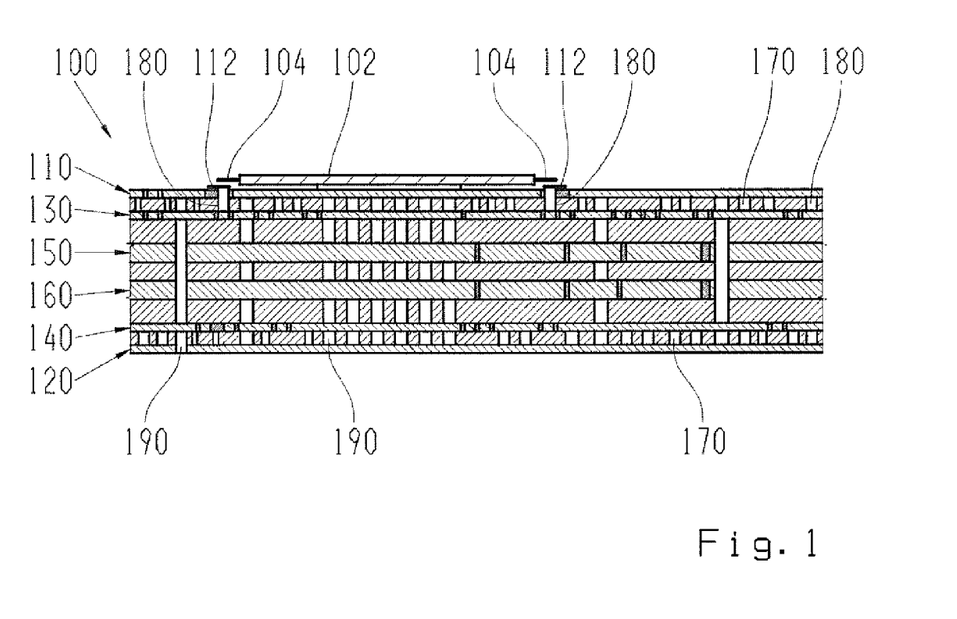
FIGS. 1 to 4 depict a printed circuit board in accordance with the embodiments of the present invention.

FIG. 1 shows a printed circuit board 100 in accordance with an embodiment of the present invention. Thereby, a section view of the printed circuit board 100 is shown in FIG. 1. The printed circuit board 100 is equipped with an electrical circuit in the form of a semiconductor chip 102, which is connected to the printed circuit board 100 by means of chip contacts 104. The printed circuit board 100 features a first outer layer 110 with connecting surfaces 112, a second outer layer 120, a first inner layer 130, a second inner layer 140, a first supply voltage layer 150, and a second supply voltage layer 160. As through-holes, the printed circuit board 100 features micro-through-holes 170, through-holes 180, and thermal through-holes 190. In accordance with the embodiment shown in FIG. 1, from top to bottom in FIG. 1, the first outer layer 110, the first inner layer 130, the first supply voltage layer 150, the second supply voltage layer 160, the second inner layer 140 and the second outer layer 120 are stacked on top of one another in this order. Thereby, FIG. 1 only shows a partial section of the printed circuit board 100 through all layers, in cross-section.

The number of layers 110, 120, 130, 140, 150, 160 is thereby exemplary, and may in practice differ from the embodiment shown in FIG. 1.

The printed circuit board 100 may be used, for example, in a control unit for a vehicle transmission. For example, the printed circuit board 100 may comprise a 6-layer thick copper board with HDLV matrix technology (HDLV=high density laser vias) for high-temperature applications.

The semiconductor chip 102 represents an electrical circuit, as it is known to a skilled person in the field. The chip contacts 104 of the semiconductor chip 102 may be connector pins, connector contacts, connector wires or the like. The chip contacts 104 of the semiconductor chip 102 are connected to the connecting surfaces 112, which are arranged on the first outer layer 110 of the printed circuit board 100. Thus, the semiconductor chip 102 is mechanically and electrically connected to the first outer layer 110 of the printed circuit board 100.

The first outer layer 110 of the printed circuit board 100 may represent a surface layer of the printed circuit board 100. On the first outer layer 110 of the printed circuit board 100, the connecting surfaces 112 are arranged for contacting the semiconductor chips 102. Even if they are not explicitly shown in FIG. 1, conducting paths of a short length, in accordance with the embodiment shown in FIG. 1, may also be formed in the first outer layer 110 of the printed circuit board 100. Areas of the first outer layer 110 of the printed circuit board 100, in which no connecting surfaces 112 or conducting paths are formed, may represent a supply voltage area. The supply voltage area may, for example, be subject to ground potential. The supply voltage area may be formed contiguously, or may comprise individual partial areas. In the supply voltage area, the first outer layer 110 of the printed circuit board 100 may be coated and/or flooded with an electrically and thermally conductive material. The first outer layer 110 of the printed circuit board 100 is further described with reference to FIG. 5. The first outer layer 110 of the printed circuit board 100 is arranged or stacked adjacent to the first inner layer 130 of the printed circuit board 100.

The first inner layer 130 of the printed circuit board 100 may represent a signal layer or, as an alternative or in addition, an unbundling layer of the printed circuit board 100. In accordance with the embodiment of the present invention shown in FIG. 1, the first inner layer 130 of the printed circuit board 100 is arranged or stacked between the first outer layer 110 and the first supply voltage layer 150. Even if it is not explicitly shown in FIG. 1, the first inner layer 130 of the printed circuit board 100 may feature a majority of conducting paths or unbundling channels. Areas of the first inner layer 130 of the printed circuit board 100, in which no conducting paths are formed, may represent a supply voltage area. The supply voltage area may, for example, be subject to ground potential. The supply voltage area may be formed contiguously, or may comprise individual partial areas. In the supply voltage area, the first inner layer 130 of the printed circuit board 100 may be coated and/or flooded with an electrically and thermally conductive material, such as copper. The first inner layer 130 is further described with reference to FIG. 6.

The through-holes 180 are formed in order to electrically connect the first outer layer 110 and the first inner layer 130 with one another. The through-holes 180 may be laser through-holes. The through-holes 180 may be lined or completely filled with an electrically conductive material. The through-holes 180 may comprise micro-through-holes. In the cross-section of the printed circuit board 100 shown in FIG. 1, two through-holes 180 are illustrated. Thereby, the through-holes 180 are formed adjacent to the connecting surfaces 112 of the first outer layer 110. The through-holes 180 are electrically connected with the connecting surfaces 112 of the first outer layer 110. In addition, the through-holes 180 are electrically connected with conducting paths of the first inner layer 130. Thus, signal lines of the first outer layer 110 and the first inner layer 130 are connected with one another with electrically conductive effect through the through-holes 180.

The first supply voltage layer 150 is arranged or stacked between the first inner layer 130 and the second supply voltage layer 160. In accordance with the embodiment of the present invention shown in FIG. 1, the first supply voltage layer 150 features a greater thickness than the first inner layer 130, and in addition or as an alternative than the first outer layer 110. The first supply voltage layer 150 features conducting paths or conducting surfaces for a high current. Areas of the first supply voltage layer 150 of the printed circuit board 100, in which no conducting paths are formed, may represent a supply voltage area. The supply voltage area may, for example, be subject to ground potential. The supply voltage area may be formed contiguously, or may comprise individual partial areas. In the supply voltage area, the first supply voltage layer 150 of the printed circuit board 100 may be coated and/or flooded with an electrically and thermally conductive material. The supply voltage areas of the first supply voltage layer 150 feature a greater thickness than the supply voltage areas of the first outer layer 110, and in addition or as an alternative of the first inner layer 130. The first supply voltage layer 150 is further described with reference to FIG. 7.

The second supply voltage layer 160 may correspond in structure to the first supply voltage layer 150. There may be slight deviations or differences regarding, for example, the dimensions of the conducting paths and/or conducting surfaces and supply voltage areas between the second supply voltage layer 160 and the first supply voltage layer 150. In accordance with the embodiment of the present invention shown in FIG. 1, the second supply voltage layer 160 is arranged or stacked between the first supply voltage layer 150 and the second inner layer 140.

The second inner layer 140 may correspond in structure to the first inner layer 130. There may be slight deviations or differences regarding, for example, the alignment and dimensions of the conducting paths and supply voltage areas between the second inner layer 140 and the first inner layer 130. In accordance with the embodiment of the present invention shown in FIG. 1, the second inner layer 140 is arranged or stacked between the second supply voltage layer 160 and the second outer layer 120.

The second outer layer 120 may represent a floor layer of the printed circuit board 100. In accordance with the embodiment shown in FIG. 1, the second outer layer 120 of the printed circuit board 100 is arranged adjacent to the second inner layer 140. The second outer layer 120 of the printed circuit board 100 may be formed in order to be attached to a support element, for example, within a vehicle transmission. For this purpose, the second outer layer 120 of the printed circuit board 100 may form a floor surface that is at least partially flat. Areas of the second outer layer 120 of the printed circuit board 100, in which no connecting surfaces are formed, may represent a supply voltage area. The supply voltage area may, for example, be subject to ground potential. The supply voltage area may be formed contiguously, or may comprise individual partial areas. In the supply voltage area, the second outer layer 120 of the printed circuit board 100 may be coated and/or flooded with an electrically and thermally conductive material, such as copper. The second outer layer 120 is further described with reference to FIG. 8.

The micro-through-holes 170 produce a connection between the first outer layer 110 and the first inner layer 130, and between the second outer layer 120 and the second inner layer 140. To be more precise, the micro-through-holes 170 produce a connection between a supply voltage area of the first outer layer 110 and a supply voltage area of the first inner layer 130 along with a supply voltage area of the second outer layer 120 and a supply voltage area of the second inner layer 140. The micro-through-holes 170 may be, for example, laser through-holes 170. The micro-through-holes 170 are filled with a heat-conductive material, such as copper. The micro-through-holes 170 are drilled as blind holes in the printed circuit board 110, for example by means of a laser, and filled with conductive material. In accordance with the embodiment of the present invention shown in FIG. 1, the micro-through-holes 170 connect two layers of the printed circuit board. The printed circuit board 100 features a majority of the micro-through-holes 170. Even if they are not explicitly shown in FIG. 1, the micro-through-holes 170 are arranged in groups or matrices.

For reasons of clarity and space, only two micro-through-holes 170 are provided with reference signs in FIG. 1. The micro-through-holes 170 are further described with reference to FIGS. 5, 6, 8, 11 and 12. Each of the micro-through-holes 170 serves the purpose of transferring heat between the outer two layers 110, 130, 120, 140 of the printed circuit board 100. Given the distribution of the micro-through-holes across large areas, a very rapid transfer of heat is able to be realized.

The thermal through-holes 190 are formed through all layers 110, 130, 150, 160, 140 and 120 in the printed circuit board 100. Thus, the thermal through-holes 190 extend from the first outer layer 110 to the second outer layer 120. The thermal through-holes 190 may be considered as so-called "thermal vias". The thermal through-holes 190 are filled with a heat-conductive material. In FIG. 1, in the area of the semiconductor chips 102, a number of thermal through-holes 190 that is larger than the numbers outside the area of the semiconductor chips 102 is formed in the printed circuit board 100. For reasons of clarity and space, only two thermal through-holes 190 are provided with reference signs in FIG. 1. The thermal through-holes 190 are further described with reference to FIGS. 5 to 8.

Figure 2:
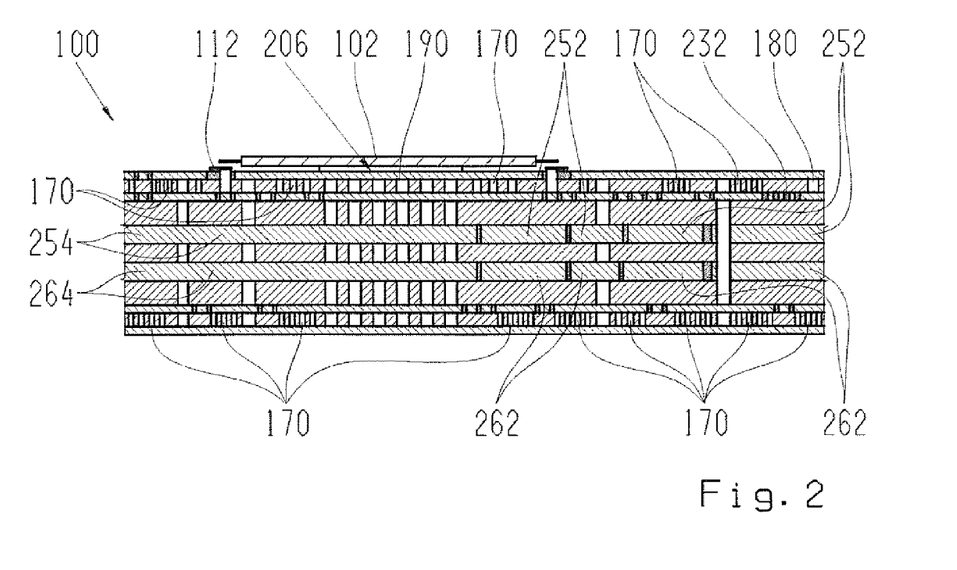

FIG. 2 shows a printed circuit board 100 in accordance with another embodiment of the present invention. In FIG. 2, a section view of the printed circuit board 100 is shown. Thereby, the printed circuit board 100 may correspond to the printed circuit board from FIG. 1, whereas the number of micro-through-holes 170 differs. For reasons of clarity and space, the layers of the printed circuit board 100 are not provided with reference signs in FIG. 2. The layers of the printed circuit board 100, and their sequence, correspond to those of the printed circuit board from FIG. 1.

FIG. 2 shows, in addition to FIG. 1, an exposed connecting surface 206 arranged between the semiconductor chip 102 and the first outer layer, conducting paths 232 of the first inner layer, conducting paths 252 and supply voltage areas 254 of the first supply voltage layer, and conducting paths 262 along with supply voltage areas 264 of the second supply voltage layer. The exposed connecting surface 206 may comprise, for example, a metal plate or the like. The exposed connecting surface 206 is arranged on a surface of the semiconductor chip 102 facing the first outer layer of the printed circuit board 100. The exposed connecting surface 206 is in contact with the first outer layer of the printed circuit board 100 and is designed to facilitate heat dissipation from the semiconductor chip 102 to the thermal through-holes 190 of the printed circuit board 100 in the area of the semiconductor chip 102. As an alternative or in addition, the exposed surface 206 may be arranged on a surface of the semiconductor chip 102 turned away from the first outer layer of the printed circuit board 100. In such a case, an additional heat sink (not shown) may be attached to the exposed surface 206.

The conducting paths 232 of the first inner layer may be, for example, signal conducting paths, unbundling channels or the like. The conducting paths 252 of the first supply voltage layer and the conducting paths 262 of the second supply voltage layer may be high current conducting paths. The conducting paths 252 of the first supply voltage layer and the conducting paths 262 of the second supply voltage layer may be formed as conducting surfaces. The supply voltage areas 254 of the first supply voltage layer and the supply voltage areas 264 of the second supply voltage layer may lie on a different potential relative to the conducting paths 252 and the conducting paths 262.

Figure 3:
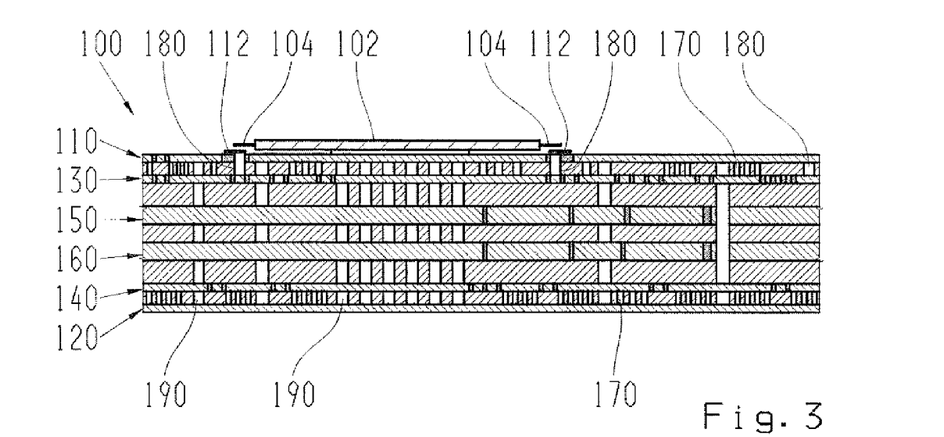

FIG. 3 shows a printed circuit board 100 in accordance with one embodiment of the present invention. In FIG. 3, a section view of the printed circuit board 100 is shown. Thereby, the printed circuit board 100 may correspond to the printed circuit board from FIG. 1 or FIG. 2. The representation in FIG. 3 thereby largely corresponds to the representation from FIG. 1. Thus, in terms of FIG. 3, reference is also made to the description regarding FIG. 1.

Through-hole technology or via technology, as the case may be, for HDLV matrix technology for the printed circuit board 100 is illustrated by FIG. 3. All statements in this regard may also be viewed as referring to the embodiments shown in FIGS. 1, 2 and 4 to 8. For thermal management, there are only three relevant types of through-holes or vias, as the case may be. The micro-through-holes 170 or micro-laser through-holes, as the case may be, in the first outer layer 110 and the first inner layer 130, the micro-through-holes 170 or micro-laser through-holes, as the case may be, in the second outer layer 120 and the second inner layer 140, and finally the thermal through-holes 190 or through-hole thermal vias, as the case may be, through all layers of the printed circuit board 100. The exact diameters of the individual through-holes arise from the respective manufacturing necessity for the printed circuit board 100. In accordance with the embodiments of the present invention, the number of micro-through-holes 170 with HDLV matrix technology is greatly increased proportionally. The thicknesses of the supply voltage areas or copper layers, as the case may be, in the individual layers, whereas the supply voltage layers represent a variable with regard to the basic copper thickness, may amount to (for example): 18 μm basic copper in the first outer layer 110, 12-18 μm basic copper in the first inner layer 130, 35-400 μm basic copper in the supply voltage layers 150, 160, 12-18 μm basic copper in the second inner layer 140 and 18 μm basic copper in the second outer layer of 120. The printed circuit board 100 is thus symmetrically structured. The final copper thicknesses may be affected by copper plating in the production process.

Figure 4:
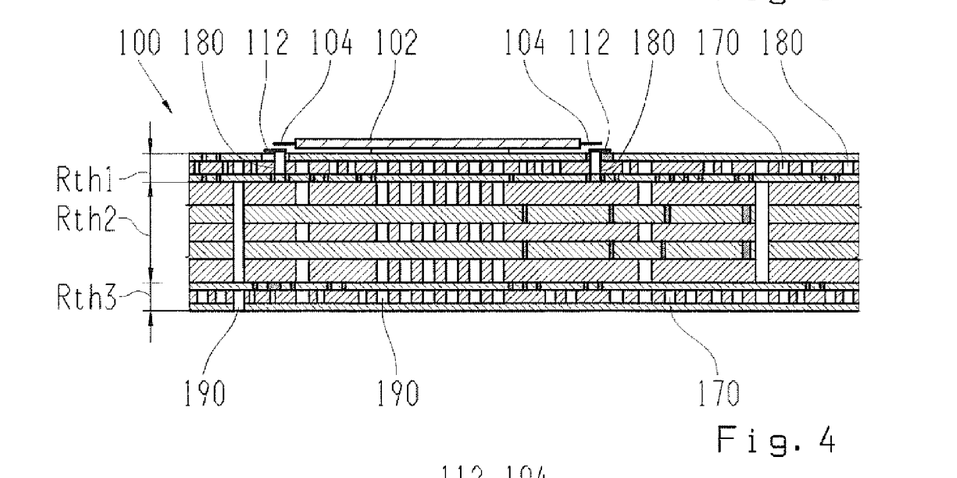

FIG. 4 shows a printed circuit board 100 in accordance with one embodiment of the present invention. In FIG. 4, a section view of the printed circuit board 100 is shown. Thereby, the printed circuit board 100 may correspond to the printed circuit board from FIG. 1 or FIG. 2 or FIG. 3. Thus, only additional elements of the printed circuit board 100 in FIG. 4 are described. In terms of all other elements, reference is made to the description regarding FIGS. 1 to 3. For reasons of clarity and space, the layers of the printed circuit board 100 are not provided with reference signs in FIG. 4. The layers, along with their sequence, of the printed circuit board 100 correspond to those of the printed circuit board from FIG. 1.

In addition to FIG. 1, FIG. 4 shows a first thermal resistance Rth1, a second thermal resistance Rth2, and a third thermal resistance Rth3. The first thermal resistance Rth1 refers to the first outer layer and the first inner layer. The second thermal resistance Rth2 refers to the first and the second supply voltage layer. The third thermal resistance Rth3 refers to the second outer layer and the second inner layer. The thermal resistances Rth1, Rth2 and Rth3 give rise to the overall thermal resistance in the thickness direction or the Z-direction, as the case may be, of the printed circuit board 100.

By the first outer layer and the first inner layer, along with the second outer layer and the second inside layer, being strongly coupled with one another through the use of the majority of micro-through-holes 170 with HDLV matrix technology, the overall thermal resistance is lowered. Likewise, the supply voltage layers with thick copper lowers the overall thermal resistance. Through this structure of the printed circuit board 100, the volume of copper increases relative to the volume of the complete printed circuit board 100. The supply voltage layers serve the purpose of managing the high current. Given the surrounding copper, the conducting paths arranged in the supply voltage layers and flowing from the high current heat up only slowly. The surrounding copper gives rise to inertia. The remaining copper then serves as a capacity buffer for high temperature loads. Generally, the power unit and the control unit must not be thermally separated, by which separate ground wires and ground surfaces are not provided. There is only one complete ground surface, which is used for horizontal thermal expansion. With the thermal through-holes 190, the vertical dissipation (Rth) of the heat is likewise significantly improved. The first outer layer and the first inner layer, along with the second outer layer and the second inner layer, are thermally coupled with one another through the matrices of the micro-through-holes 170. This gives rise to a better thermal capacity (Cth). Unbundling channels and thermal channels are introduced for optimal heat capacity and/or thermal dissipation.

Figure 5:
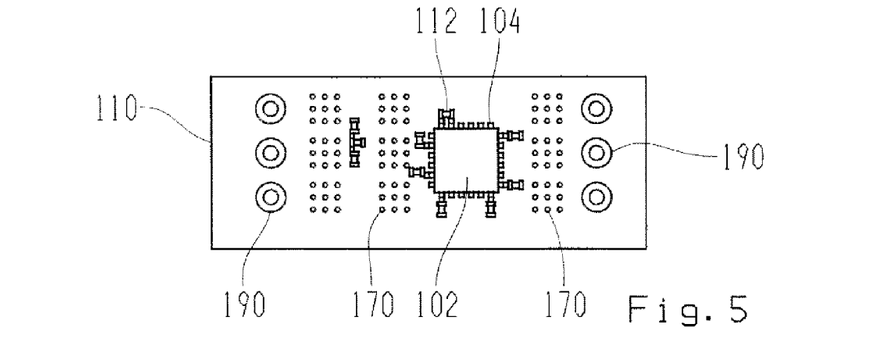
FIGS. 5 to 8 depict various layers of a printed circuit board in accordance with the embodiments of the present invention.

FIG. 5 shows a top view of a first outer layer 110 of a printed circuit board in accordance with one embodiment of the present invention. The first outer layer 110 may comprise the first outer layer from one of the FIGS. 1 to 4. It shows the semiconductor chip 102, which is connected through the chip connections 104 to connecting surfaces 112 of the first outer layer 110, and a majority of the micro-through-holes 170, along with the thermal through-holes 190. In the top view of FIG. 5, additional micro-through-holes 170 and, in the alternative or as an addition, additional through-holes 190 may be covered by the semiconductor chip 102. The semiconductor chip 102, the chip contacts 104, and the connecting surfaces 112 may comprise elements that are well-known to one skilled in the relevant field. Therefore, a more detailed description of such elements is omitted here. The first outer layer 110 mainly features components in the form of the semiconductor chip 102 and short direct conductor connections, along with a support layer for soldered components. Otherwise, for the formation of a supply voltage area, the first outer layer 110 is flooded with copper subject to ground potential, by which a solid thermal connection of the semiconductor chips 102 to the first outer layer 110 along with the first outer layer 110 to additional layers of the printed circuit board.

The micro-through-holes 170 are arranged in matrices. In particular, in accordance with the embodiment of the present invention shown in FIG. 5, the micro-through-holes 170 are combined into nine micro-through-holes 170 per matrix. Each matrix thus features new micro-through-holes 170. In FIG. 5, as an example, nine matrices with nine micro-through-holes 170 each are shown. The nine matrices with micro-through-holes 170 on their part form an arrangement with three parts and three columns, with matrices on the first outer layer 110. The micro-through-holes 170 are formed in the supply voltage area of the outer layer 110. The thermal micro-through-holes 190 are arranged in edge areas of the first outer layer 110. In FIG. 5, as an example, six thermal through-holes 190 are shown. The thermal through-holes 190 are arranged in two groups. Thereby, three thermal through-holes 190 are arranged in a first group in a line along a first narrow lateral edge of the first outer layer 110. The remaining three thermal through-holes 190 are arranged in a second group in a line along a second narrow lateral edge of the first outer layer 110. The micro-through-holes 170 are arranged between the two groups of thermal through-holes 190. It must be noted that the arrangement and number of the micro-through-holes 170 along with the thermal through-holes 190 shown in FIG. 5 are only examples, and may in practice deviate from that shown.

In other words, FIG. 5 may be a top view of a printed circuit board in accordance with one embodiment of the present invention. In the view of FIG. 5, the first outer layer 110 of the printed circuit board covers all other layers of the printed circuit board. The printed circuit board may be a component of a control unit for a vehicle transmission. The printed circuit board may also comprise a control unit for a vehicle transmission, whereas a housing in which the printed circuit board may be at least partially incorporated is not shown.

Figure 6:
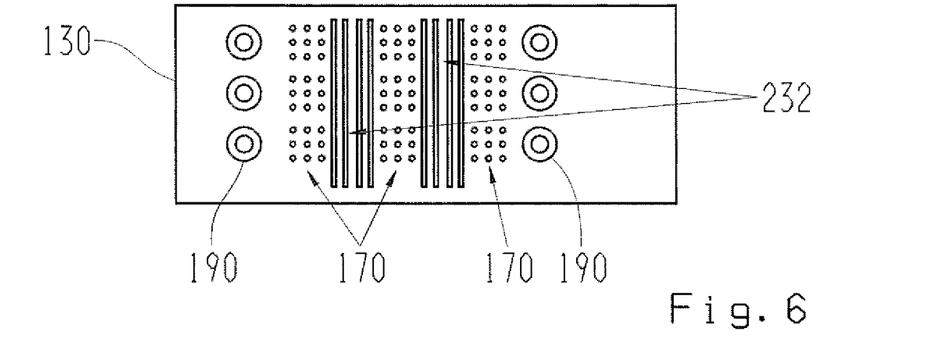

FIG. 6 shows a top view of one first inner layer 130 of a printed circuit board in accordance with one embodiment of the present invention. The first inner layer 130 may comprise the first inner layer of one of the FIGS. 1 to 4. The first inner layer 130 features a majority of micro-through-holes 170, a majority of thermal through-holes 190, and a majority of unbundling channels in the form of conducting paths 232. Thereby, the micro-through-holes 170 and the thermal through-holes 190 correspond in number and order to those of the first outer layer from FIG. 5. The conducting paths 232 are arranged in groups running parallel between the matrices of the micro-through-holes 170. Thus, FIG. 6 shows, from left to right, a column-by-column sequence of three thermal through-holes 190 one below the other, three matrices each with nine micro-through-holes 170 one below the other, one group of (as an example) four conducting paths 232 next to one another, three additional matrices each with nine micro-through-holes 170 one below the other, one additional group of (as an example) four conducting paths 232 next to one another, three further matrices each with nine micro-through-holes 170 one below the other and three additional thermal through-holes 190 one below the other. The first inner layer 130 serves the purpose of unbundling the control and communication connections in the printed circuit board. For this purpose, the first inner layer 130 features an ultra-fine conductive structure (not shown). Free surfaces are flooded with copper, in order to form a supply voltage area, and fill it with micro-through-holes 170 with HDLV matrix technology. Thereby, the first inner layer 130 may be identical or nearly identical to the second inner layer from FIGS. 1 to 4. The first and the second inner layer are provided for the unbundling of the printed circuit board, whereas one layer may realize the vertical or horizontal direction of unbundling. Generally, the surfaces needed for conducting paths may be flooded with copper. Channels for unbundling in the form of the conducting paths 232 and devices for thermal management in the form of micro-through-holes 170 alternate with one another.

Figure 7:
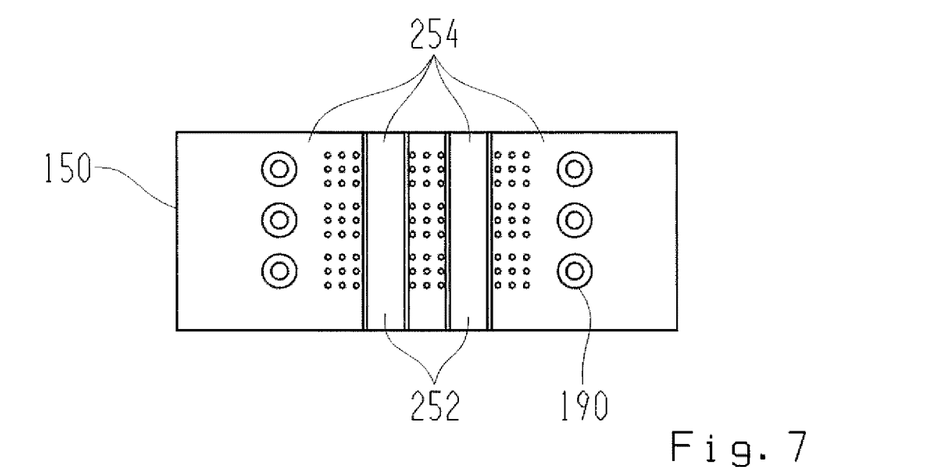

FIG. 7 shows a top view of a first supply voltage layer 150 of a printed circuit board in accordance with one embodiment of the present invention. The first supply voltage layer 150 may comprise the first supply voltage layer from one of the FIGS. 1 to 4. The first supply voltage layer 150 features a majority of thermal through-holes 190. Thereby, the thermal through-holes 190 correspond in number and arrangement to those of the first outer layer from FIG. 5 and the first inner layer from FIG. 6. The first supply voltage layer 150 also features conducting paths 252 and supply voltage areas 254. The conducting paths 252 may comprise high current conducting paths. Thus, the first supply voltage layer 150 features conducting paths 252 for a high current. Otherwise, the first supply voltage layer 150 is flooded with ground surface in the form of the supply voltage area 254. The property of absorbing short-term temperature shocks, thus thermal capacity (Cth), of the first supply voltage layer 150 is thereby increased. In terms of technology, the first supply voltage layer 150 belongs to thick copper technology (thickness of the supply voltage areas of, for example, 35 μm-400 μm). Thereby, the first supply voltage 150 may be identical or nearly identical to the second supply voltage layer from FIGS. 1 to 4. The supply voltage layers are designed for high current conducting paths. The remainder of the supply voltage layers outside of the conducting paths is flooded with copper, for example. The flooded copper surface features a high capacity character (Cth) and likewise improved dissipation behavior for heat (Rth).

Figure 8:
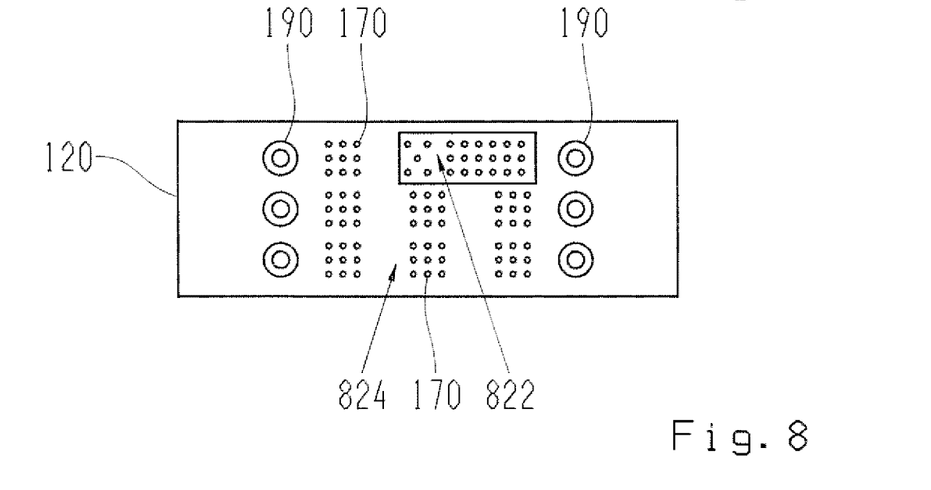

FIG. 8 shows a top view of a second outer layer 120 of a printed circuit board in accordance with one embodiment of the present invention. The second outer layer 120 may comprise the second outer layer from one of the FIGS. 1 to 4. The second outer layer 120 features a majority of micro-through-holes 170, a majority of thermal through-holes 190, a connecting surface 822 and a supply voltage area 824.

The second outer layer 120 features a surface that is as homogenous as possible. This leads to a solid contact with a support element, on which the printed circuit board is attached, or with an intervening gap filler. This gives rise to a delivery of heat across large areas to a support element, for example in a mechanical housing system of a transmission control unit of a vehicle. The HDLV matrix technology facilitates an even distribution of heat. The second outer layer 120 acts as a contact surface for a separating element or for heat sinks, as the case may be, and (if applicable) even through films or heat conducting compounds. The contact surfaces, i.e. the conducting surface 822 and the supply voltage areas 824, are, for example, completely flooded with copper. Different potentials are formed as surfaces. Heat from the printed circuit board may be delivered to the second outer layer 120 over the thermal through-holes 190, the majority of micro-through-holes 170, and the supply voltage areas 824 containing (for example) copper, to a support element.

Figure 9:
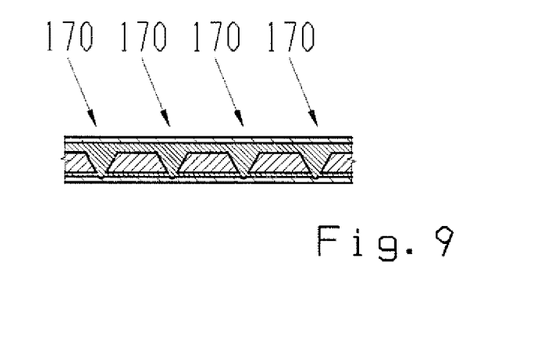
FIGS. 9 and 10 depict micro-through-holes in accordance with the embodiments of the present invention.

FIG. 9 shows a section view of micro-through-holes in accordance with one embodiment of the present invention. It shows a section through, for example, four micro-through-holes 170 through an outer layer of a printed circuit board. Thereby, the micro-through-holes 170 comprise, for example, laser through-holes filled with copper. The filling with copper gives rise to a high thermal coupling between both sides of the layers arranged on the outer layer, made of thermally and electrically conductive material.

Figure 10:
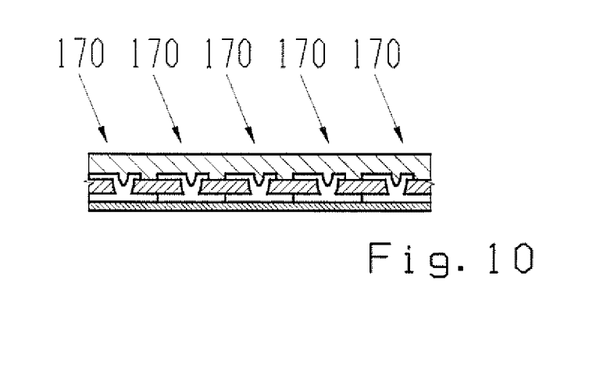

FIG. 10 shows a section view of micro-through-holes in accordance with a further embodiment of the present invention. It shows a section through, for example, five micro-through-holes 170 through two layers of a printed circuit board. Thereby, the micro-through-holes 170 may comprise, for example, laser through-holes lined with copper or provided with copper sleeves.

A representation of HDLV matrix technology is possible with two micro-through-holes from FIGS. 9 and 10.

Figure 11:
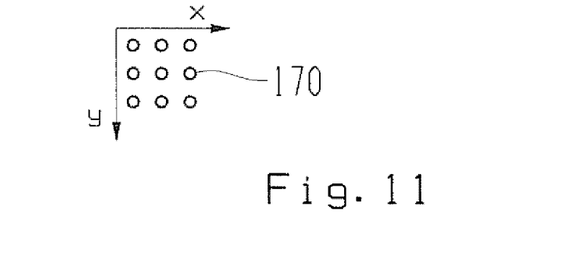
FIGS. 11 and 12 depict arrangements of micro-through-holes in accordance with the embodiments of the present invention.

FIG. 11 shows an arrangement of micro-through-holes 170 in accordance with one embodiment of the present invention. Thereby, the micro-through-holes 170 are arranged in a matrix with columns X and rows Y. It shows nine micro-through-holes 170, which are arranged in a matrix with three columns and three rows. It may thereby comprise a matrix of micro-through-holes 170, as shown in FIGS. 5 to 8. An HDLV matrix may have, for example, 3 to 6 columns X and 3 to 6 rows Y. The spacing from the center of one micro-through-hole 170 to the center of another micro-through-hole 170 within the matrix may amount to, for example, 0.3 mm. For example, a laser hole may measure 0.1 mm, and the micro-through-hole may measure 0.3 mm. A matrix of X by Y is possible, where X may be equal to Y.

Figure 12:
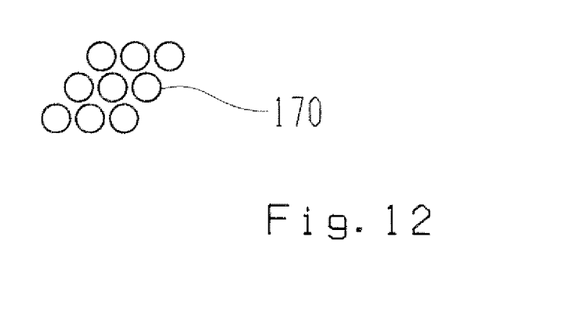

FIG. 12 shows an arrangement of micro-through-holes 170 in accordance with a further embodiment of the present invention. FIG. 12 shows nine micro-through-holes 70 as an example. Thereby, the arrangement of micro-through-holes 170 in FIG. 12 is offset by about 45° with regard to the arrangement in FIG. 11. The offset arrangement may facilitate an adjustment of the micro-through-holes 170 on the conducting paths. An arbitrary angle for an offset arrangement is possible. To be precise, the micro-through-holes 170°are arranged offset to one another, which gives rise to a parallelogram-shaped arrangement.

Referring to FIGS. 1 to 12, the following once again illustrates in summary the various embodiments of the present invention. In general, it must be noted that neither the number of used copper layers, nor their thicknesses, are limiting; what was solely attempted was describing the concept underlying the embodiments of the present invention on the basis of a specific example. The same is true for the number of HDLVs. Of course, it is clear to one skilled in the art that he may arbitrarily vary the number and/or thickness and/or quantity of layers.

In accordance with the embodiment of the present invention, given the strategic topology, heat may be dissipated through the conducting paths and/or conducting surfaces and through through-holes. For this purpose, the topology was developed through through-holes and conducting paths in accordance with the embodiments of the present invention. Thereby, the first outer layer 110 and the first inner layer 130, along with the second outer layer 120 and the second inner layer 140, are thermally coupled with the HDLV matrix of the micro-through-holes 170. The supply voltage layers 150 and 160 for high current are arranged in the inner area of the printed circuit board. Through the surrounding copper, a slowed temperature rise is achieved there. For the unbundling principle, 3 types of through-holes are necessary: the micro-through-holes 170 between the first outer layer 110 and first inner layer 130, the micro-through-holes 170 between the second outer layer 120 and the second inner layer 140, and the thermal through-holes 190 through all layers of the printed circuit board 100. The conducting paths and through-holes are arranged in such a manner that thermal channels and channels for unbundling alternate with one another. The thermal through-holes 190 produce the thermal connection to all layers. As large areas of the second outer layer 120 may be thermally connected to a support element, for example a housing of a transmission control unit, good thermal dissipation is also able to be achieved. In summary, for the thermal through-holes 190, embodiments of the present invention also use HDLV matrices made of micro-through-holes 170 for improving the heat dissipation of the printed circuit board 100. This results in an improvement in the overall thermal resistance, thus an improvement in the overall thermal resistance in the Z-direction of the printed circuit board 100, heat management that is overall improved and improved heat dissipation for the printed circuit board 100. Thus, embodiments of the present invention facilitate an improvement of the printed circuit board 100 or the high-temperature board, as the case may be, with a majority of micro-through-holes 170 with HDLV matrix technology.

The embodiments described and shown in the figures are only selected as examples. Different embodiments may be combined with one another, completely or in reference to individual characteristics.

Moreover, an embodiment may be supplemented by characteristics of a further embodiment. Even if the described HDLV matrix has been described preferably in conjunction with printed circuit boards of transmission control units for motor vehicles, the preferred HDLV matrix may be used for printed circuit boards for other electronic devices for power electronics.

REFERENCE SIGNS

100 Printed circuit board
102 Semiconductor chip
104 Chip contact
110 First outer layer
112 Connecting surface
120 Second outer layer
130 First inner layer
140 Second inner layer
150 First supply voltage layer
160 Second supply voltage layer
170 Micro-through-hole
180 Through-hole
190 Thermal through-hole
206 Exposed connecting surface
232 Conducting path
252 Conducting path
254 Supply voltage area
262 Conducting path
264 Supply voltage area
Rth1 First thermal resistance
Rth2 Second thermal resistance
Rth3 Third thermal resistance
822 Connecting surface
824 Supply voltage area

The invention claimed is:

1. A multilayer printed circuit board particularly useful in a vehicle transmission, the multilayer printed circuit board comprising: a first outer layer having a supply voltage area; a semiconductor chip connected to the first outer layer;
a first inner layer adjacent to the first outer layer, the first inner layer having a supply voltage area; and a first plurality of micro-through holes formed between the supply voltage area of the first outer layer and the supply voltage area of the first inner layer,
the micro-through holes of the first plurality of micro-through holes filled at least partially with a heat conductive material, at least some of the first plurality of micro-through holes not positioned below the semiconductor chip at the first outer layer,
wherein the micro-through holes of the first plurality of micro-through holes are configured into at least one group, wherein the micro-through holes within the group are arranged without a conducting path between adjacent micro-through holes.

2. The printed circuit board as in claim 1, wherein:
the supply voltage area of the first outer layer is formed from a heat conductive and electrically conductive material and is an area of the first outer layer in which conductive paths of the first outer layer are not formed; and
the supply voltage area of the first inner layer is formed from a heat conductive and electrically conductive material and is an area of the first inner layer in which conductive paths of the first inner layer are not formed.

3. The printed circuit board as in claim 1, further comprising a supply voltage layer adjacent to the first inner layer, the supply voltage layer having a supply voltage area with a thickness that is greater than a thickness of the supply voltage area of at least one of the first inner layer or the first outer layer.

4. The printed circuit board as in claim 1, further comprising a second outer layer and an adjacent second inner layer, and a second plurality of micro-through holes defined between the second outer layer and the second inner layer, wherein the supply voltage layer is a first supply voltage layer and further comprising a second supply voltage layer, the first and second supply voltage layers configured between the first inner layer and the second inner layer, the first plurality of micro-through holes being separate from the second plurality of micro-through holes.

5. The printed circuit board as in claim 1, wherein the micro-through holes are configured into at least one group of nine micro-through holes with a spacing between adjacent micro-through holes not exceeding 0.85 mm, wherein the micro-through holes within the group are arranged without a conducting path between adjacent micro-through holes.

6. The printed circuit board as in claim 1, wherein the printed circuit board is a component of a vehicle transmission control device.

7. The printed circuit board as in claim 1, wherein the micro-through holes are filled at least partially with a heat conductive material and the supply voltage areas of the first outer layer and the first inner layer are formed from a heat conductive and electrically conductive material, the heat conductive material within the micro-through holes extending between and connecting the heat conductive and electrically conductive material of the supply voltage areas of the first outer layer and the first inner layer.

8. The printed circuit board as in claim 1, wherein the supply voltage area of the first outer layer comprises copper that forms a thermal connection between the semiconductor chip and the supply voltage area of the first outer layer.

9. The printed circuit board as in claim 2, wherein the supply voltage area of the first inner layer is a ground voltage area, the first inner layer further comprising a plurality of conducting paths outside of the ground voltage area.

10. The printed circuit board as in claim 4, further comprising at least one through hole formed through all of the layers of the circuit board, the through hole filled at least partially with a heat conductive material.

11. The printed circuit board as in claim 10, wherein the semiconductor chip covers the at least one through hole at the first outer layer.

12. A multilayer printed circuit board, comprising: a first outer layer having a supply voltage area; a semiconductor chip connected to the first outer layer; a first inner layer adjacent to the first outer layer, the first inner layer having a supply voltage area; a second outer layer positioned opposite the first outer layer; a second inner layer adjacent to the second outer layer; and a thermal through hole formed through the first outer layer, the first inner layer, the second inner layer and the second outer layer, the thermal through hole filled at least partially with a heat conductive material, the semiconductor chip positioned over the through hole at the first outer layer; a plurality of micro-through holes formed between the supply voltage area of the first outer layer and the supply voltage area of the first inner layer, the micro-through holes filled at least partially with a heat conductive material, at least some of the plurality of micro-through holes formed between the supply voltage area of the first outer layer and the supply voltage area of the first inner layer away from the semiconductor chip at the first outer layer, wherein the micro-through holes are configured into at least one group, wherein the micro-through holes within the group are arranged without a conducting path between adjacent micro-through holes.

\* \* \* \* \*